(12) United States Patent
Horibe et al.

(10) Patent No.: US 7,091,515 B2
(45) Date of Patent: Aug. 15, 2006

(54) HIGH-TEMPERATURE SUPERCONDUCTING DEVICE AND MANUFACTURING METHOD THEREOF

(75) Inventors: Masahiro Horibe, Tsukuba (JP); Hideo Suzuki, Yokohama (JP); Yoshihiro Ishimaru, Yokohama (JP); Hironori Wakana, Shimotsuga (JP); Keiichi Tanabe, Mito (JP)

(73) Assignees: Fujitsu Limited, Kawasaki (JP); International Superconductivity Technology Center, The Juridical Foundation, Tokyo (JP)

( * ) Notice: Subject to any disclaimer, the term of this patent is extended or adjusted under 35 U.S.C. 154(b) by 0 days.

(21) Appl. No.: 10/809,924

(22) Filed: Mar. 26, 2004

(65) Prior Publication Data

US 2004/0232405 A1 Nov. 25, 2004

(30) Foreign Application Priority Data

Mar. 28, 2003 (JP) .............................. 2003-089776

(51) Int. Cl.
*H01L 29/06* (2006.01)
(52) U.S. Cl. .............................. 257/31; 257/33; 257/34
(58) Field of Classification Search ............ 257/31–35, 257/E39.012, E39.014, E39.015
See application file for complete search history.

(56) References Cited

U.S. PATENT DOCUMENTS

| 5,400,026 | A | * | 3/1995 | Bradley ...................... 341/133 |
| 5,464,813 | A | * | 11/1995 | Hascicek et al. ............ 505/490 |
| 5,550,101 | A | * | 8/1996 | Nagata et al. .............. 505/162 |
| 5,945,383 | A | * | 8/1999 | Hunt .......................... 505/329 |
| 2002/0074544 | A1 | * | 6/2002 | Sung et al. .................... 257/31 |
| 2004/0134967 | A1 | * | 7/2004 | Moeckly et al. ............ 228/101 |

FOREIGN PATENT DOCUMENTS

| JP | 2000-353831 | 12/2000 |
| JP | 2001-244511 | 9/2001 |

OTHER PUBLICATIONS

Soutome, Y., et al., Investigation of Ramp-type Josephson Junctions with Surface-modifed Barriers, IEEE Transactions on Applied Superconductivity, vol. 11, No. 1, Mar. 2001, pp. 163-166.*

Institute of Physics Publishing, Supercond. Sci. Technol. vol. 14, pp 1052-1055, 2001; "The improvement of the characteristics of ramp-edge junctions with interface modified barriers".

* cited by examiner

*Primary Examiner*—T. N. Quach
(74) *Attorney, Agent, or Firm*—Armstrong, Kratz, Quintos, Hanson & Brooks, LLP.

(57) ABSTRACT

At least two ramp-edge-structure Josephson junctions having different critical current densities to one another are provided on a substrate.

6 Claims, 15 Drawing Sheets

HIGH-TEMPERATURE SUPERCONDUCTING DEVICE AND MANUFACTURING METHOD THEREOF

CROSS-REFERENCE TO RELATED APPLICATIONS

This application is based upon and claims the benefit of priority from the prior Japanese Patent Application No. 2003-089776, filed on Mar. 28, 2003, the entire contents of which are incorporated herein by reference.

BACKGROUND OF THE INVENTION

1. Field of the Invention

This invention relates to a high-temperature superconducting device and a manufacturing method thereof and, more particularly, to a high-temperature superconducting device characterized by a means to form the high-temperature superconducting device by a ramp-edge-type superconductor junction with various critical current densities $J_c$, and a manufacturing method thereof.

2. Description of the Related Art

In recent years, oxide high-temperature superconductors as typified by yttrium-type superconductors have been expected to be applied to various fields such as sensors and logic circuits, since their superconducting state is exhibited at a temperature higher than liquid nitrogen, suggesting that its cooling is simpler than those of the conventional metal-type superconductors which require cooling by liquid helium (refer to Japanese Patent Application Laid-open No. 2000-353831, for example).

Such oxide high-temperature superconductors have a characteristic that superconducting current thereof tends to take paths along a Cu—O plane formed of copper and oxygen in a crystal, so that it is preferable that the junction traverses along a parallel direction with respect to such a Cu—O plane. Accordingly, a ramp-edge-type junction is proposed as a superconductor junction used for a high-temperature superconducting device.

For such ramp-edge-type junctions, are known a type in which a barrier layer is formed of deposited films, and a type in which a barrier layer is formed by modifying its surface with ion implantation (refer to Japanese Patent Application Laid-open No. 2001-244511, and Supercond. Sci. Technol., Vol. 14, pp.1052–1055, 2001, for example).

Further, among superconducting circuits, a single flux quantum (SFQ) circuit has a characteristic that it is operated at an ultrahigh speed and with low energy, so that, where the SFQ circuit is designed and manufactured with the high-temperature superconductor, a superconducting loop having Josephson junction and included in a circuit has to be designed to fulfill a condition that the product of an inductance L and a critical current value $I_c$ of the Josephson junction of the loop (product of L multiplied by $I_c$) is one quantum magnetic flux ($\Phi_o$) or ½ $\Phi_o$.

In such a case, the higher is the product of the critical current $I_c$ and the normal conducting resistance $R_n$ of the junction used in the SFQ circuit being the product of $I_c \times R_n$, the narrower the width of an SFQ pulse becomes, so that a high-speed operation can be realized. An interface-modified or interface-engineered junction of the high-temperature superconductor can make the product of $I_c \times R_n$ higher by increasing an interface current density $J_c$, the state of which will be explained below with reference to FIG. 18.

FIG. 18 is an actual measurement data showing dependence of the product of $I_c \times R_n$ on $J_c$. Whilst an exponent varies depending on the state of the interface-engineered junction of the high-temperature superconductor, the following dependences are obtained:

$$I_c \times R_n = J_c^{0.2}, \text{ or}$$

$$I_c \times R_n = J_c^{0.5}$$

Hence, it is understood that the product of $I_c \times R_n$ can be made larger by increasing $J_c$.

Here, a superconductor junction element having the interface-engineered ramp-edge junction is explained with reference to FIGS. 19A to 19C and FIGS. 20A to 20D.

First, in FIG. 19A, a YBCO ($YB_{a2}Cu_3O_{7-x}$) layer 52 which serves as a lower electrode and a $C_eO_2$ film 53 which serves as an insulating layer are sequentially deposited on a $SrTiO_3$ substrate 51 by using a pulse laser deposition method.

Next, in FIG. 19B, a photo-resist is coated, patterning is performed by exposure and development, and thereafter a reflowing process is performed, so that a resist pattern 54 is formed. Argon ion 55 is then irradiated to perform ion milling by using the resist pattern 54 as a mask, so that a ramp-edge structure is formed.

Subsequently, in FIG. 19C, a ramp slope 56 which is exposed is irradiated with argon ion 57 in such a manner that, for example, the argon ion 57 is irradiated vertically with respect to the $SrTiO_3$ substrate 51, so that a surface-modified layer 58 is formed.

As shown in FIG. 20A, subsequently a YBCO layer 59 forming an upper electrode is deposited by using a sputtering method.

Subsequently, in FIGS. 20B to 20D, a bridge portion 60 is formed by performing ion milling to the YBCO layer 59, so that a basic structure of the interface-engineered ramp-edge junction is accomplished.

It is noted that FIG. 20B is a plain view, FIG. 20C is a schematic sectional view taken along an A–A' dotted line in FIG. 20B, and FIG. 20D is a schematic sectional view taken along a B–B' dotted line in FIG. 20B.

In the case described above, the ramp slopes are formed in four directions by processing the lower electrode layer, and ion is irradiated vertically with respect to the substrate surface, whereby a damage layer is formed uniformly over the ramp slopes. As a result, interface-engineered ramp-edge junctions with a uniform critical current density $J_c$ can be formed in the four directions, so that $J_c$ for the intra-circuit junctions can be made uniform, whereby an accurate circuit operation is realized.

As described above, in designing a SFQ circuit, the inductance L and the critical current $I_c$ in the circuit have to be determined by fulfilling the condition for the product of L×$I_c$ (which is L×$I_c$<$\Phi_o$). However, in the ramp-edge structure, in which a barrier layer is sandwiched by the upper and lower electrodes through the bridge portion, parasitic inductance is generated in series with the junction.

The parasitic inductance exists in no small way, because the size of the Josephson junction or the minimum length of interval between the electrode and the wiring are determined based on a lithographic limit and constraints with respect to material processing. In such a circumstance, if $J_c$ of the Josephson junction is made higher in order to make the product of $I_c \times R_n$ larger, the junction width, which is the bridge width, has to be narrowed so as to obtain a constant-value $I_c$.

In such a case, the length of the bridge which exists in series with the Josephson junction becomes longer than the width thereof, and the parasitic inductance becomes larger.

For example, in a state where the electrode thickness, bridge length, and sheet inductance respectively are constant, if a Josephson junction is fabricated in a manner that it has a constant-value critical current $I_c$, the critical current density $J_c$ being made N times higher results in the junction width of 1/N times wider, and the parasitic inductance of N times larger.

Consequently, when $J_c$ of the Josephson junction is made higher, a loop inductance of a superconducting loop containing the Josephson junction becomes larger.

Hence, the above-described condition for the product of $L \times I_c$ ($L \times I_c < \Phi_o$) can no longer be fulfilled, and the circuit cannot be operated.

In order to deal with such a state, in the circuit design prevailing at present, the inductance is determined in tune with a circuit whose restriction on $L \times I_c$ is the most strict among the elements in the circuit, and the junction width is widened in order to reduce the influence of the parasitic inductance as much as possible.

However, if the junction width is widened in order to reduce the parasitic inductance influence as much as possible, $J_c$ of the Josephson junction cannot be made higher, so that the junction with relatively small-value product of $I_c \times R_n$ has to be used. Consequently, the SFQ pulse width becomes wider, and a problem is caused in which the circuit performance is deteriorated in such a manner that the operational speed of the SFQ circuit is restricted, or the operational uncertainty (jitter) becomes greater.

SUMMARY OF THE INVENTION

It is an object of the present invention to allow a stable high-speed operation of a superconductor circuit such as an SFQ circuit.

FIGS. 1A and 1B are schematic diagrams of the present invention. With reference to FIGS. 1A and 1B, a means to solve the problem through the present invention is explained.

Note that in FIGS. 1A and 1B, reference numerals 4, 7, and 8 respectively show a lower electrode layer, an upper electrode layer, and a bridge.

As can be seen in FIGS. 1A and 1B, in order to achieve the above-described object, the present invention provides at least two ramp-edge Josephson junctions 9 and 10 whose critical current densities differ to each other, above a substrate 1 of a high-temperature superconducting device.

By separately fabricating at least the two ramp-edge Josephson junctions 9 and 10 whose critical current densities $J_c$ differ to each other above the substrate 1, and by utilizing each performance of the junctions differently depending on each element circuit, both a high-speed operation and a stable operation of the superconducting circuit device such as a SFQ circuit can be realized. Consequently, the performance of the high-temperature superconducting device can be enhanced.

In the above case, a Josephson junction 9 having a relatively high critical current density is used so that $I_c \times R_n$ is made larger, allowing a high-speed operation, while a Josephson junction 10 having a relatively low critical current density is used so that the junction width is widened and the inductance L is reduced, allowing a stable operation in a manner which fulfills the condition of $L \times I_c < \Phi_o$ in a circuit element having a strict $L \times I_c$ condition.

Circuit elements not having such a strict $L \times I_c$ condition as referred to above include a pulse generator and a comparator, and at least one of which should contain the Josephson junction 9 of the relatively high critical current density.

That is to say, the superconducting circuit device includes circuits whose restrictions on the product of $L \times I_c$ are not strict, and specifically, those falling in such a category include a pulse generator and a comparator determining performance and operational speed of the entire circuit.

In such an element circuit, in order to make the product of $L \times I_c$ higher, it is possible to narrow the junction width so that $J_c$ can be made higher without being restricted by the $L \times I_c$ product condition.

That is to say, it is important that junctions with different performances are used separately, in such a manner that an element circuit requiring high speed and high precision should contain a high-$J_c$ junction, while an element circuit requiring a strict condition on the product of $L \times I_c$ should include a relatively low $J_c$ junction so that the parasitic inductance L can be reduced.

Further, the above-described Josephson junctions 9 and 10 having different critical current densities to each other should form interface-engineered barriers 5 and 6 having respectively different damages, or barriers 5 and 6 having deposited films of respectively different thicknesses.

Furthermore, in the Josephson junctions 9 and 10 having different critical current densities to each other, after forming the ramp-edge structure having plural slopes in the same island regions 2 and 3, the ion irradiation should be performed under the condition that at least a damage to one of the slopes is different from damages to other slopes. For example, ion should be irradiated from a specific diagonal direction under the condition that the substrate 1 is not rotated with respect to the island regions 2 and 3.

Otherwise, in the Josephson junctions 9 and 10 having different critical current densities to each other, after forming the ramp-edge structure having plural slopes in the same island regions 2 and 3, the barrier layers 5 and 6 should be deposited under the condition that the deposited film thickness of at least one of the slopes is different from the deposited film thickness of other slopes. For example, a material forming the barrier layers 5 and 6 should be deposited by the sputtering method from a fixed diagonal direction under the condition that the substrate 1 is not rotated with respect to the island regions 2 and 3.

DETAILED DESCRIPTION OF THE PREFERRED EMBODIMENTS

Figure 1A:
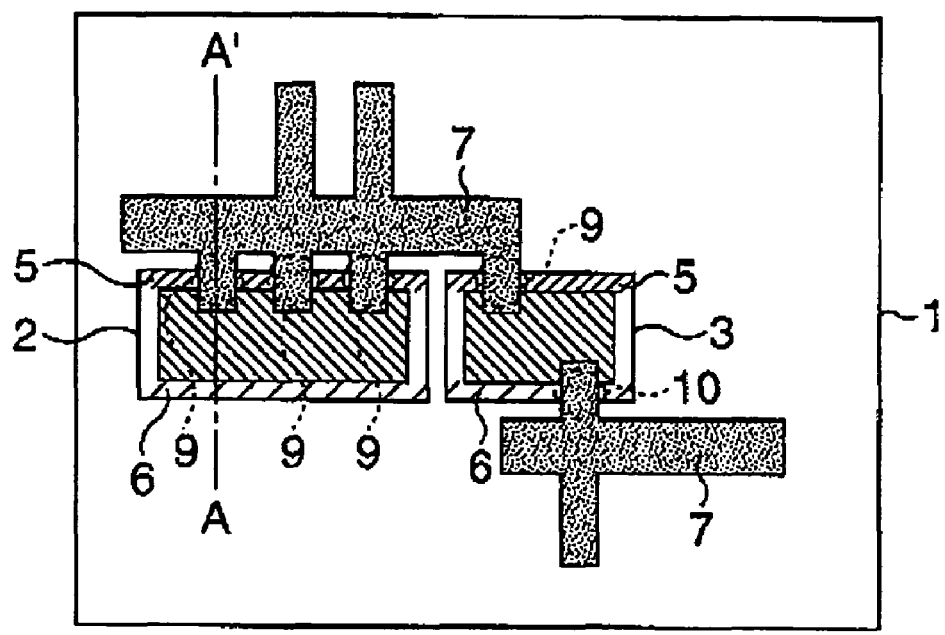
FIGS. 1A and 1B are schematic diagrams of the present invention respectively.
Figure 1B:
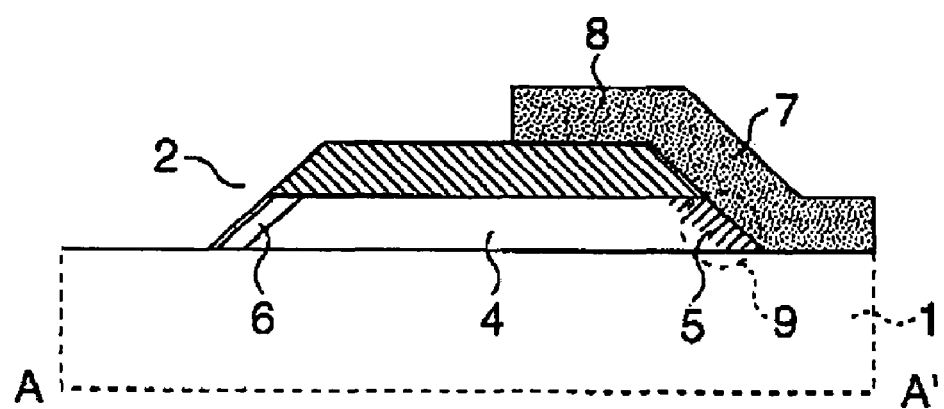

Hereinafter, a forming process of an interface-engineered ramp-edge junction according to a first embodiment of the present invention is explained with reference to FIGS. 2A to 4B.

First, as shown in 2A, a laser deposition method (PLD: pulse laser deposition) is used to sequentially deposit a lower electrode layer 12 formed of YBCO ($YBa_2Cu_3O_{7-x}$) having a thickness of 200 nm for example, and an insulating layer 13 formed of a LSAT having a thickness of 300 nm for example, on a LSAT substrate 11 formed of $[LaAlO_3]_{0.3}[Sr(Al,Ta)O_3]_{0.7}$.

Next, as shown in 2B, a photo-resist is coated on the insulating layer 13, which is then exposed and developed. After that, the photo-resist film is reflowed by baking, so that a photo-resist pattern 14 is formed. The photo-resist pattern 14 is then used as a mask, so as to irradiate argon ion 15 from a diagonal direction with the LSAT substrate 11 rotated such that the insulating layer 13 and the lower electrode layer 12 are etched, resulting in formation of a ramp slope 16.

Figure 2A:
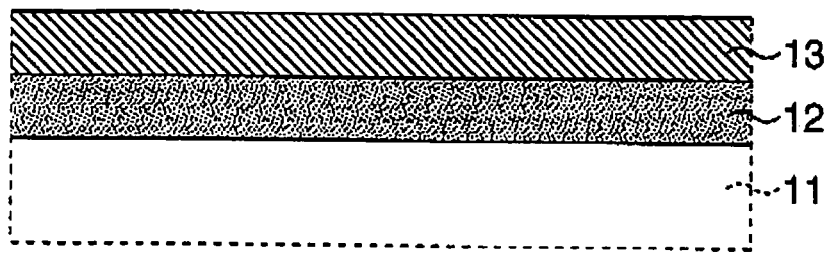
FIGS. 2A, 2B and 2C are explanatory views respectively showing a halfway formation process of an interface-engineered ramp-edge junction of a first embodiment in the present invention.
Figure 2B:
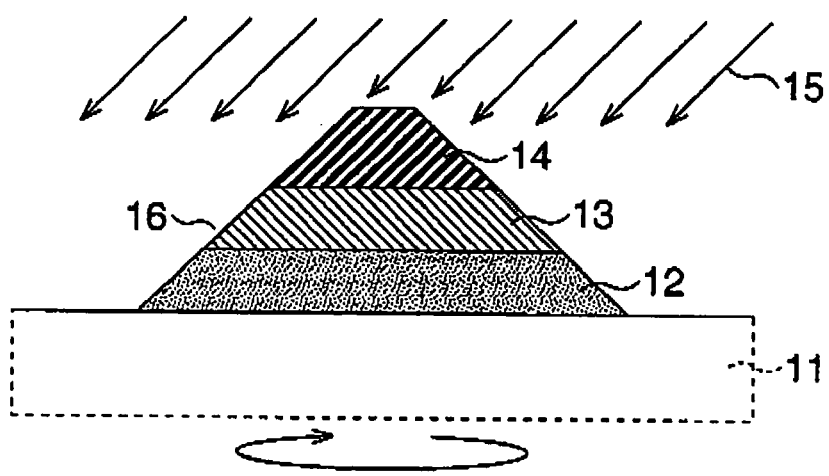
Figure 2C:
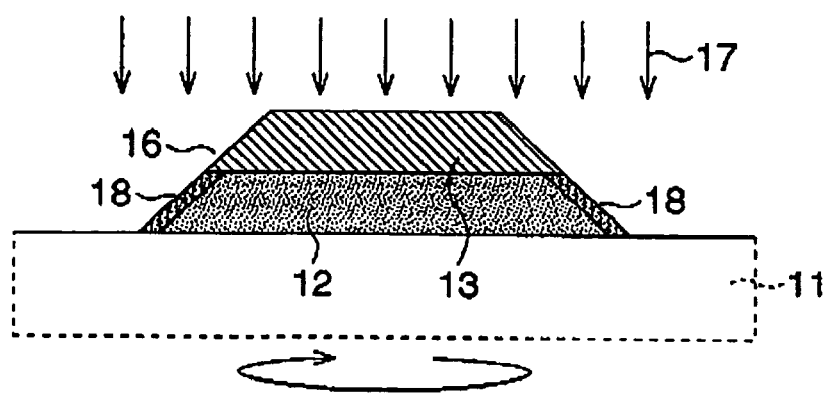

Subsequently, as shown in FIG. 2C, a photo-resist pattern 14 is removed, after which argon ion 17 is irradiated for two minutes from a vertical direction to a substrate surface with the LSAT substrate 11 rotated, so that a damage layer 18 is formed over the ramp slope 16.

Figure 3A:
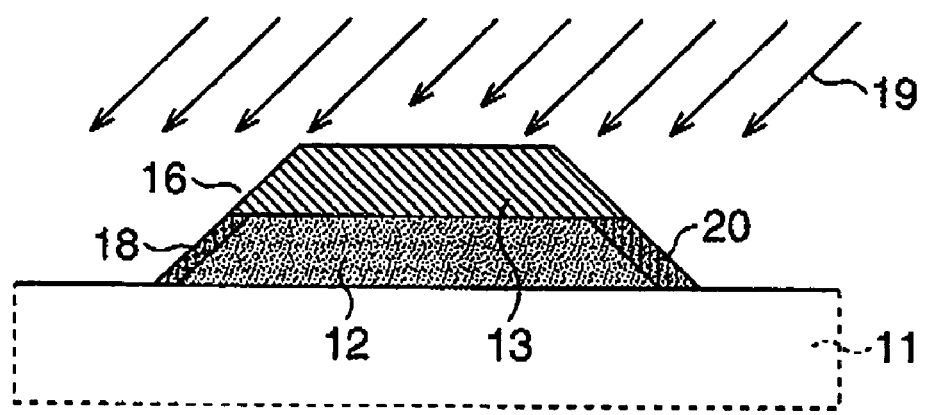
FIGS. 3A and 3B are explanatory views of the formation process following the steps shown in FIGS. 2A, 2B and 2C of the interface-engineered ramp-edge junction of the first embodiment in the present invention.

Next, as shown in FIG. 3A, argon ion 19 is irradiated at an angle of, for example, 30 degrees with respect to the substrate surface, during which the rotation of the LSAT substrate 11 is halted, so that one particular ramp slope 16 is further damaged, resulting in formation of a damage layer 20 whose damage is greater than that of the damage layer 18.

Figure 3B:
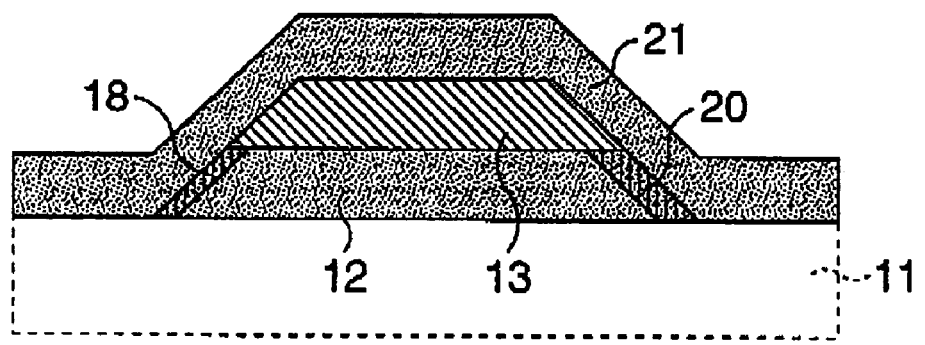

As shown in FIG. 3B, the LSAT substrate 11 is then transferred to a PLD vacuum chamber, where temperature is raised under an oxygen atmosphere up to an upper deposition temperature, and thereafter an upper electrode layer 21 composed of YBCO is deposited, to which, patterning is then performed at a part of the damage layer having a desired critical current density so as to form a bridge, so that a Josephson junction having a desired $L \times I_c$ product or $I_c \times R_n$ product can be formed.

Figure 4A:
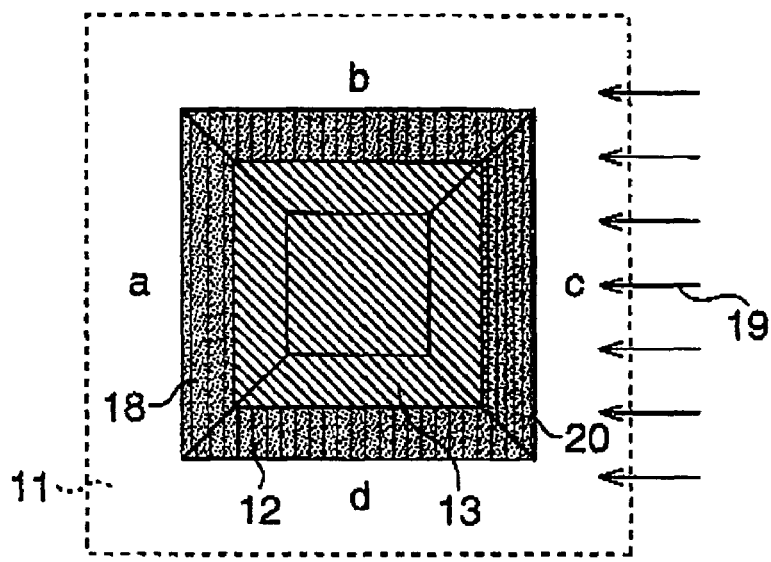
FIGS. 4A and 4B are explanatory views respectively showing a damage distribution according to ion irradiating direction in the first embodiment of the present invention.

In that case in the process shown in FIG. 3A, as shown in FIG. 4A, the argon ion 19 is irradiated to the square-shaped lower electrode layer 12 from a orthogonal direction with respect to one ramp slope 16, resulting in relative degrees of damages of: slope a<slope b=slope d<slope c, indicating that Josephson junctions having three different $J_c$s can be separately fabricated in the same substrate, since the damages serve as junction barriers.

Figure 4B:
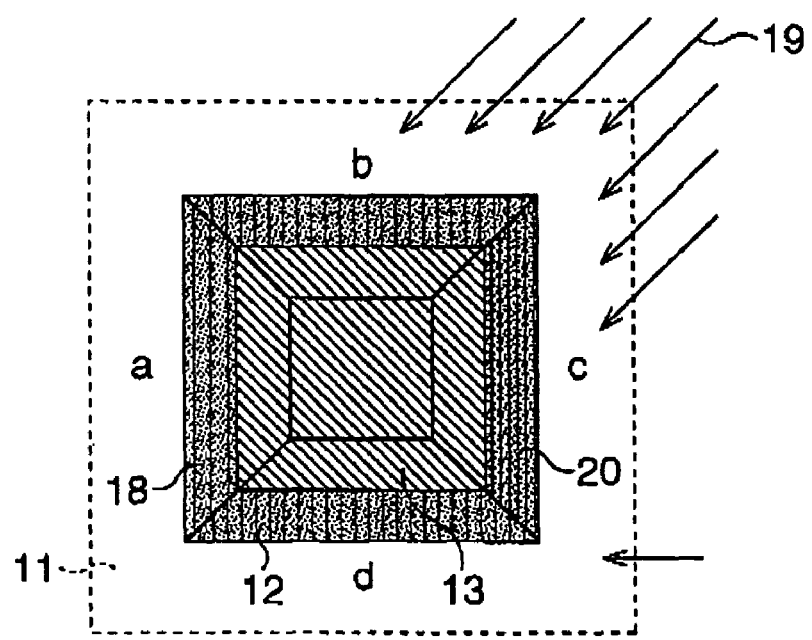

Further in the process shown in FIG. 3A, as shown in FIG. 4B, the argon ion 19 is irradiated to the square-shaped lower electrode 12 from a direction along a diagonal line of the square, resulting in relative degrees of damages of: slope a=slope d<slope b=slope c, indicating that two Josephson junctions having different $J_c$s to each other can be separately fabricated above the same substrate.

Next, with reference to FIGS. 5A to 6B, a forming process of an interface-engineered ramp-edge junction according to a second embodiment of the present invention will be explained.

Figure 5A:
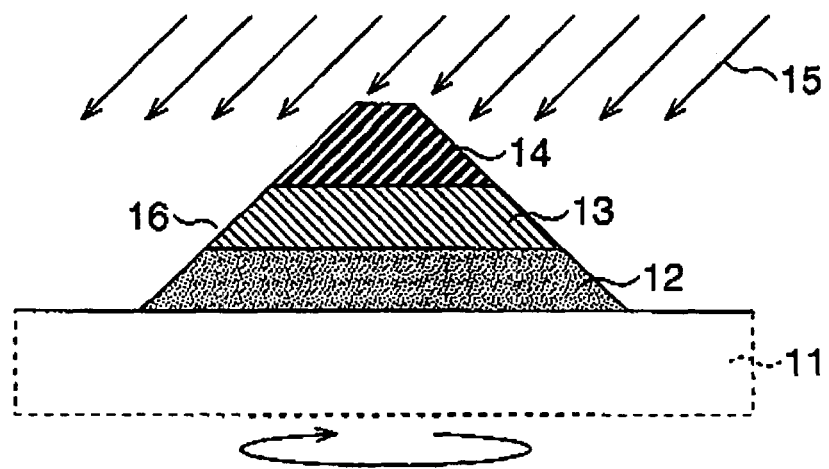
FIGS. 5A, 5B, and 5C are explanatory views respectively showing a forming process of an interface-engineered ramp-edge junction according to a second embodiment of the present invention.

First, as shown in FIG. 5A, as with the above-described first embodiment, a laser deposition method is used to sequentially deposit on a LSAT substrate a lower electrode layer 12 formed of YBCO ($YBa_2Cu_3O_{7-x}$) having a thickness of 200 nm for example, and an insulating layer 13 formed of LSAT having a thickness of 300 nm for example.

Subsequently, a photo-resist is coated on the insulating layer 13, which is then exposed and developed. The photo-resist film is then reflowed by baking, so that a photo-resist pattern 14 is formed. The photo-resist pattern 14 is then used as a mask, so as to irradiate argon ion 15 from a diagonal direction with the LSAT substrate 11 rotated, such that the insulating layer 13 and the lower electrode layer 12 are etched, resulting in formation of a ramp slope 16.

Figure 5B:
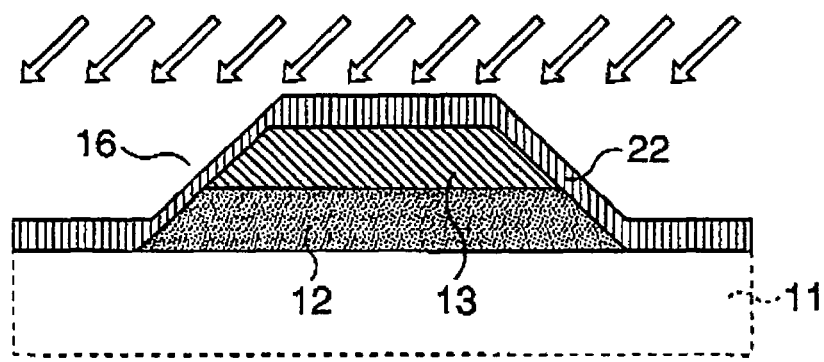

As shown in FIG. 5B, a photo-resist pattern 14 is then removed, and thereafter PBCO ($PrBa_2Cu_3O_{7-x}$) laser deposition is performed at an angle of, for example, 30 degrees with respect to the substrate surface, in such a manner that a thickly deposited portion of a barrier layer 22 becomes 30 nm for example, during which the rotation of the LSAT substrate 11 is halted.

Figure 5C:
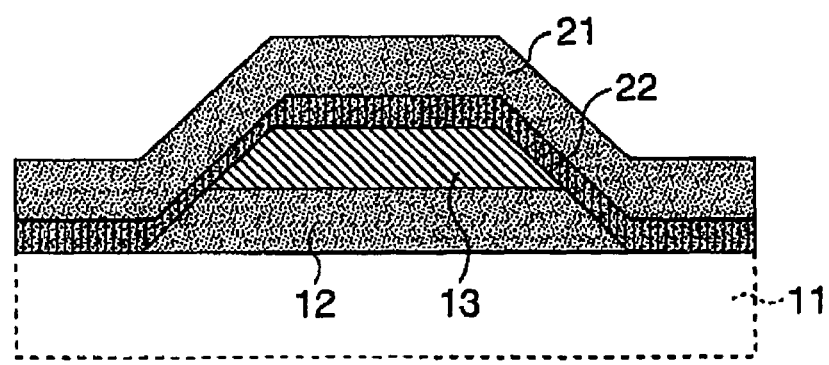

Subsequently, as shown in FIG. 5C, the LSAT substrate 11 is heated up to a deposition temperature under an oxygen atmosphere in a vacuum chamber, and thereafter an upper electrode layer 21 composed of YBCO is deposited, and patterning is performed thereto at a part of the thick barrier layer 22 having a desired critical current density so that a bridge is formed. As a result, a Josephson junction having a desired $L \times I_c$ product or $I_c \times R_n$ product can be formed.

Figure 6A:
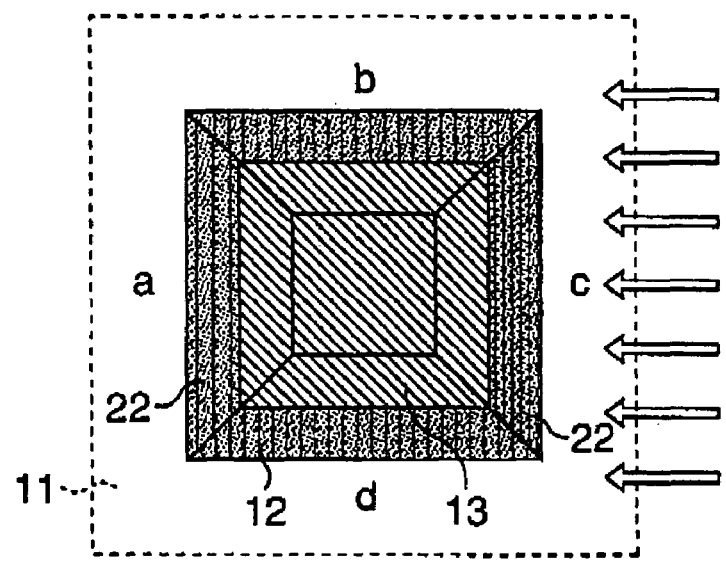
FIGS. 6A and 6B are explanatory views respectively showing a film thickness distribution according to sputtering directions in the second embodiment of the present invention.

In that case in the process shown in FIG. 5B, as shown in FIG. 6A, PBCO is deposited to the square-shaped lower electrode layer 12 from a orthogonal direction with respect to one ramp slope 16, resulting in relative film thicknesses of: slope a<slope b=slope d<slope c, so that Josephson junctions having three different $J_c$s can be separately fabricated above the same substrate.

Figure 6B:
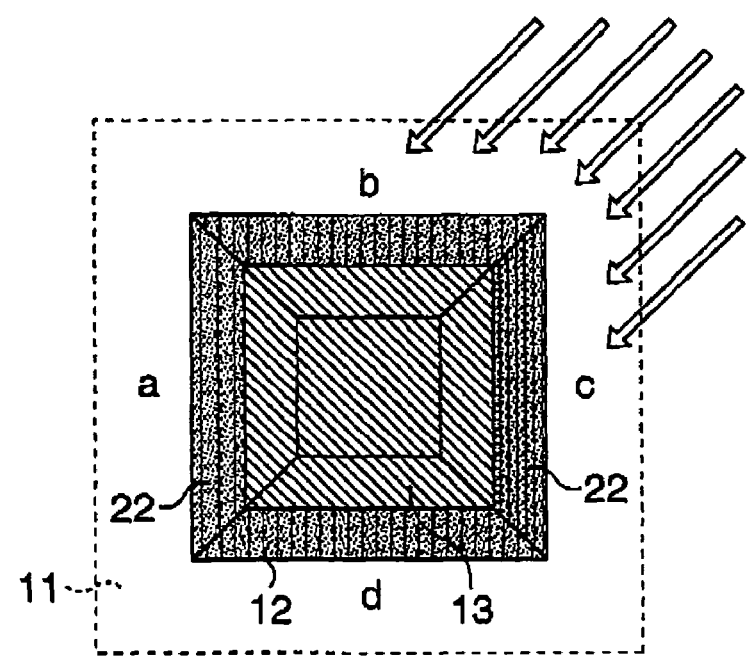

Further in the process shown in FIG. 5B, as shown in FIG. 6B, PBCO is deposited to the square-shaped lower electrode 12 from a direction along a diagonal line of the square, resulting in relative film thicknesses of: slope a=slope d<slope b=slope c, so that Josephson junctions having two different $J_c$s can be separately fabricated within the same substrate.

With the above-described conditions as premises, a superconducting circuit device according to a third embodiment of the present invention will be explained next.

Figure 7:
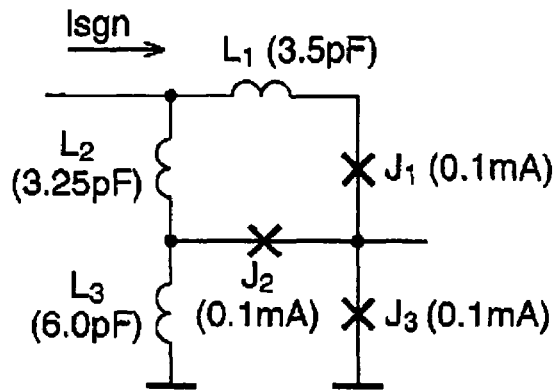
FIG. 7 shows an equivalent circuit diagram of a DC/SFQ conversion circuit.

FIG. 7 shows an equivalent circuit diagram of a DC/SFQ conversion circuit, which is one example of a pulse generating circuit, the pulse generating circuit being a basis of the superconducting circuit device in the third embodiment of the present invention.

The circuit applies normal electrical signal used in semiconductor circuits through an input $I_{sgn}$, and an SFQ pulse is outputted from an output terminal when an input signal exceeds a certain threshold level, where, the larger is the product of $I_c \times R_n$ of a Josephson junction used in the circuit, the narrower the time width of the generated pulse becomes. This state will be explained with reference to FIG. 8.

Figure 8:
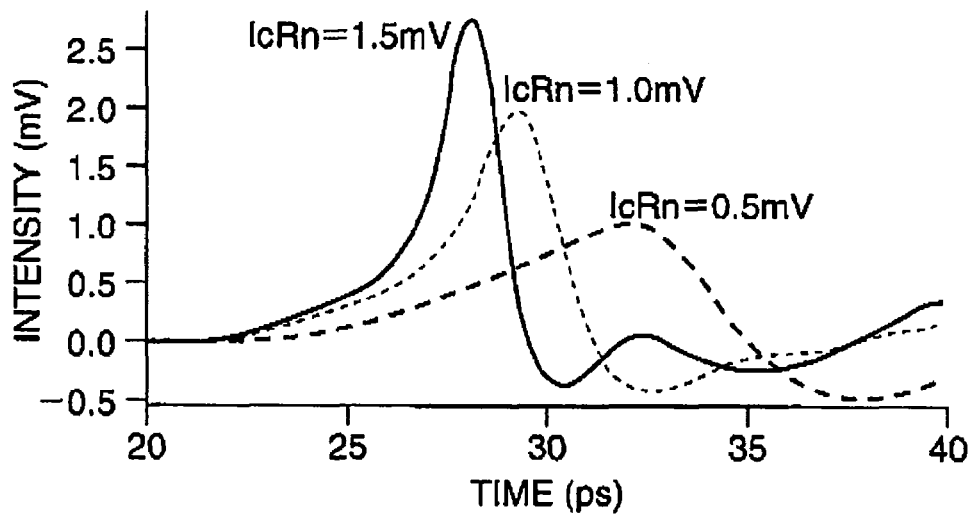
FIG. 8 is an explanatory graph showing a simulation result of generated pulses where the product of $I_c \times R_n$ is set to 0.5 mV, 1.0 mV, and 1.5 mV.

FIG. 8 shows simulation results of generated pulses where the product of $I_c \times R_n$ is set to 0.5 mV, 1.0 mV, and 1.5 mV.

The half widths of the pulses are 5.8 ps (pico seconds), 2.6 ps, and 1.85 ps respectively for the Josephson junctions having the $I_c \times R_n$ product of 0.5 mV, 1.0 mV, and 1.5 mV, so that it is understood that by using a Josephson junction having a larger $I_c \times R_n$ product, a pulse having the narrower width can be generated.

Hence, the pulse interval can be reduced in a circuit using a junction of a high $I_c \times R_n$ product, whereby the operational speed can be enhanced. In order to do so, the DC/SFQ conversion circuit should include a high-$J_c$ Josephson junction.

Figure 9:
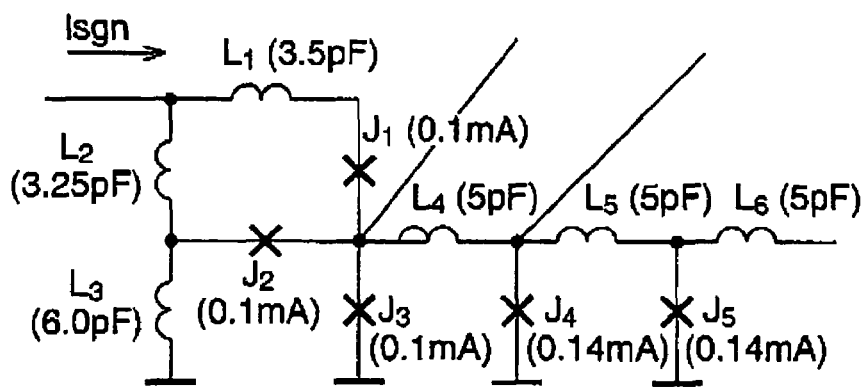
FIG. 9 is an equivalent circuit including a DC/SFQ conversion circuit and transmission line JTL.

Additionally, as shown in FIG. 9, when the condition on the product of $L \times I_c$ cannot be fulfilled in a design in which a high-$J_c$ Josephson junction is used in a pulse generating portion, the pulse width can be shaped narrower if a junction having a low $I_c \times R_n$ product is used for the DC/SFQ conversion circuit, and a junction having a high $I_c \times R_n$ product is used for a Josephson transmission line JTL in the subsequent part, as can be seen in the equivalent circuit shown.

Here, whilst the time width of the pulse generated from the DC/SFQ conversion circuit is uniform regardless of the product of $I_c \times R_n$ of the junction used at the JTL, the pulse waveform is shaped at a subsequent JTL so that the pulse width can be modified. This process will be explained with reference to FIG. 10.

Figure 10:
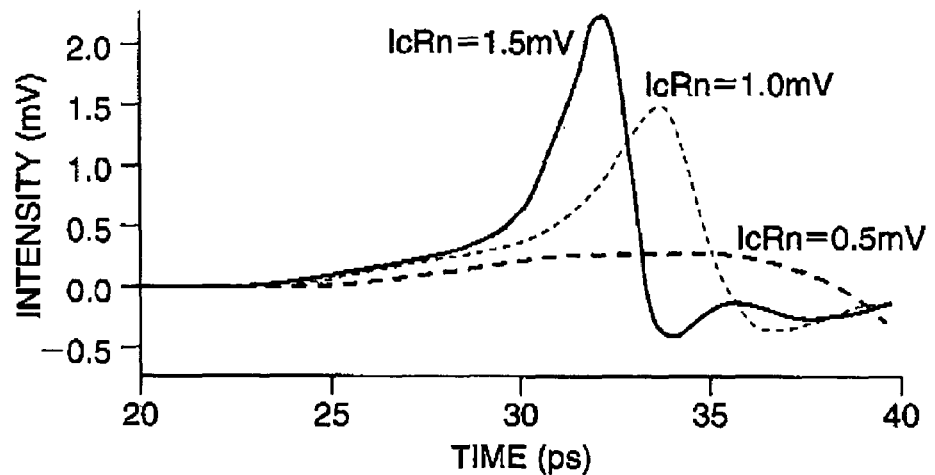
FIG. 10 is an explanatory graph showing simulation results of generated pulses where the product of $I_c \times R_n$ of the JTL portion is set to 0.5 mV, 1.0 mV, and 1.5 mV.

FIG. 10 shows simulation results where the $I_c \times R_n$ product of the junction at the JTL in FIG. 9 is set to 0.5 mV, 1.0 mV, and 1.5 mV.

It is noted that the $I_c \times R_n$ product of the junction of the DC/SFQ conversion circuit is 0.5 mV.

As shown in FIG. 10, the pulse widths are 9.6 ps (pico second) if the $I_c \times R_n$ products of the Josephson junctions $J_4$ and $J_5$ at the JTL part are 0.5 mV; 2.95 ps if the $I_c \times R_n$ products of the Josephson junctions $J_4$ and $J_5$ at the JTL part is 1.0 mV; and 2.05 ps if the $I_c \times R_n$ products of the Josephson junctions $J_4$ and $J_5$ at the JTL part are 1.5 mV. Accordingly, by making the $I_c \times R_n$ products of the Josephson junctions $J_4$, $J_5$ higher, a narrow-width pulse can be generated from a wide-width pulse.

Figure 11:
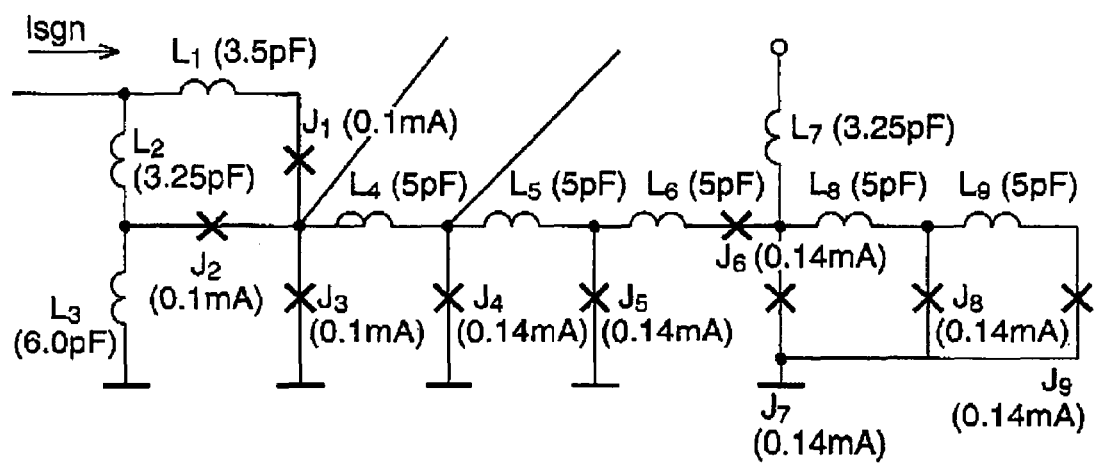
FIG. 11 is an equivalent circuit diagram including a DC/SFQ conversion circuit, JTL, comparator, and another JTL.

If such a narrow-width-pulse is used as a sampling pulse of a comparator in a circuit containing the DC/SFQ conversion circuit, JTL, and comparator, as shown in FIG. 11, jitter influence can be reduced so that a highly precise comparating operation can be realized.

Figure 12:
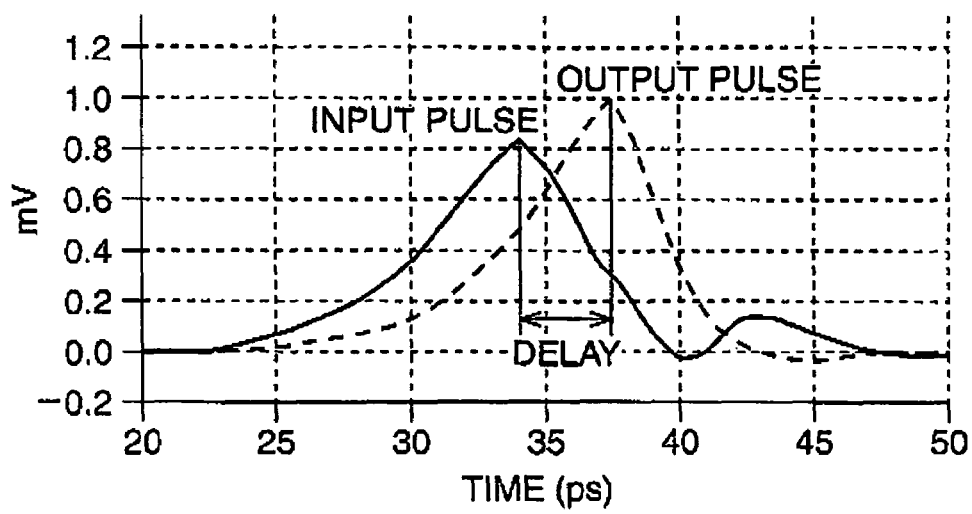
FIG. 12 is an explanatory graph showing a simulating result of time difference (delay) between an input signal and output signal to the comparator in the circuit of FIG. 11.

FIG. 12 shows a simulation result of a time difference (delay) between an input signal and output signal to the comparator of the circuit in FIG. 11.

Figure 13:
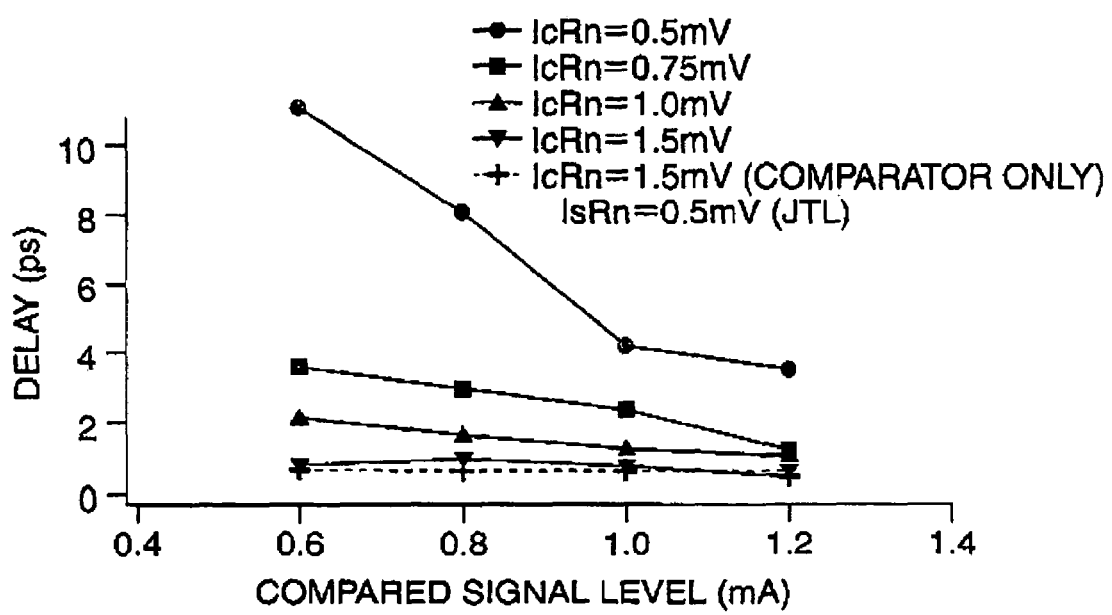
FIG. 13 is an explanatory graph showing dependence of a delay on the level of compared signal where the product of $I_c \times R_n$ is set to 0.5 mV, 0.75 mV, 1.0 mV, and 1.5 mV.

FIG. 13 shows simulation results of relationship between the delay and the compared signal inputted to the comparator where the $I_c \times R_n$ product of the Josephson junctions $J_6$ and $J_7$ contained in the comparator is set to 0.5 mV, 0.75 mV, 1.0 mV, and 1.5 mV.

It is noted that the $I_c \times R_n$ product of the Josephson junctions $J_8$ and $J_9$ of the subsequent JTL of the comparator is 0.5 mV.

As can be seen in FIG. 13, when the Josephson junction having the $I_c \times R_n$ product of 1.5 mV is used, the delay is almost constant at around 1 ps regardless of the level of the compared signal.

However, when the Josephson junction having the $I_c \times R_n$ product of 0.5 mV is used, the delay varies in the range from 10 ps to 4 ps, whereby dependence of the comparing operation to the level of the compared signal is observed.

That is to say, if the circuit includes a junction having a low $I_c \times R_n$ product, jitter is increased so that the accuracy of the comparing operation is reduced.

Figure 14:
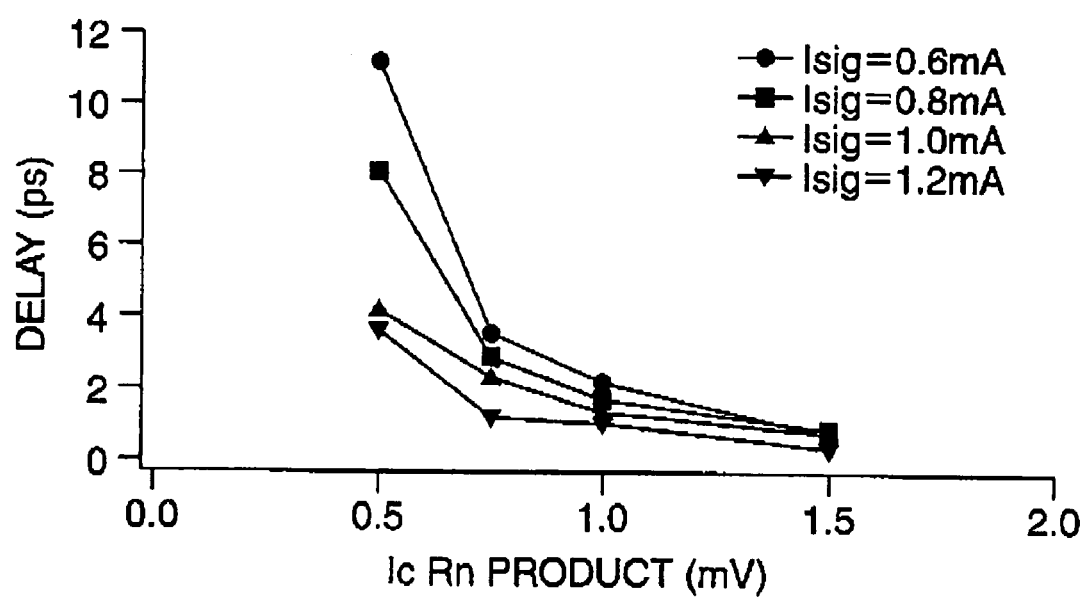
FIG. 14 is an explanatory graph showing dependence of the delay on the product of $I_c \times R_n$.

FIG. 14 shows simulated results of relationship between delay and $I_c \times R_n$ product of Josephson junction used in the circuit.

As can be seen in FIG. 14, it is understood that when the $I_c \times R_n$ product of Josephson junction is larger, the delay is smaller.

That is to say, if the product of $I_c \times R_n$ is higher, a higher-speed operation can be performed.

Figure 15A:
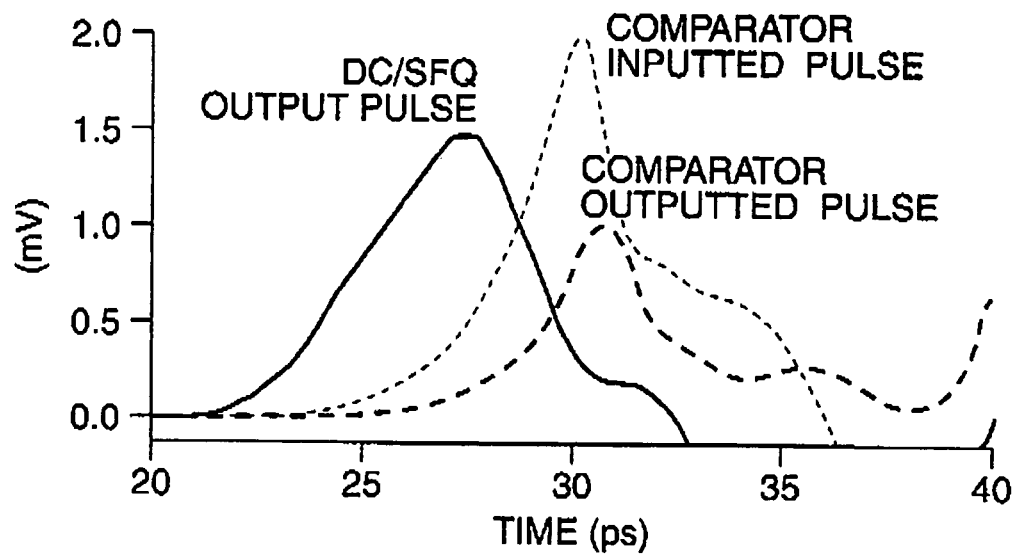
FIGS. 15A and 15B are explanatory graphs respectively showing input/output waveforms of the circuit in FIG. 11.

FIG. 15A shows simulation results, where, in the circuit shown in FIG. 11, only the $I_c \times R_n$ products of Josephson junctions $J_6$ and $J_7$ before and after the comparator are set to 1.5 mV, and the $I_c \times R_n$ products of the rest of the Josephson junctions $J_4$, $J_5$, $J_8$, and $J_9$ are set to 0.5 mV.

Figure 15B:
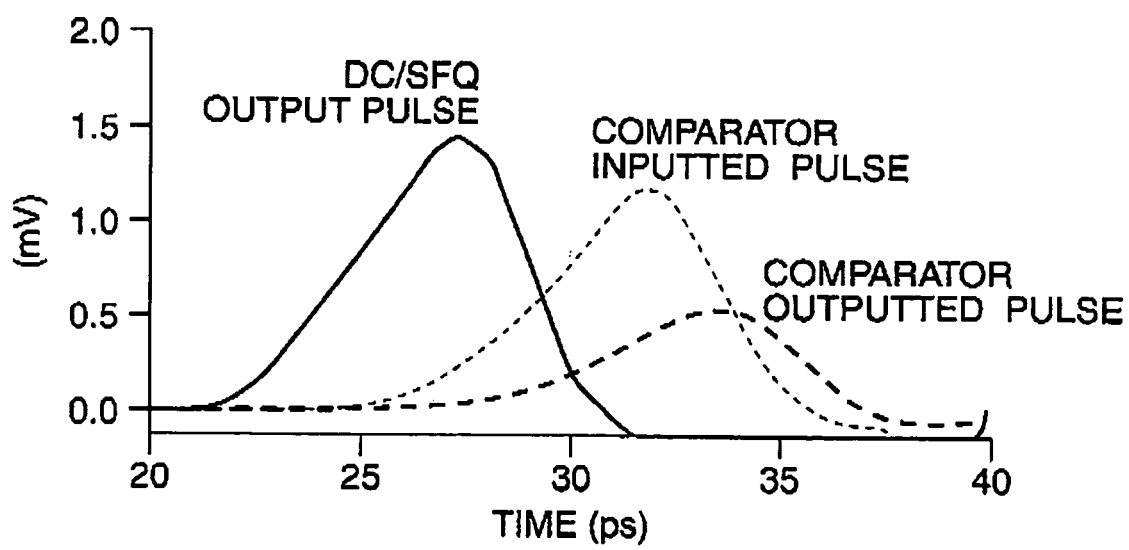

Additionally, for a comparison purpose, FIG. 15B shows simulation results where the $I_c \times R_n$ products of all the Josephson junctions are set to 0.5 mV.

As can be seen in the comparison between FIG. 15A and FIG. 15B, in the case of the embodiment of the present invention, the shape of the pulse to be inputted to the comparator is shaped into a narrow-width pulse and inputted to the comparator, and an output result thereof is obtained with a short delay.

Further, as can be seen in the graph of $I_c \times R_n = 1.5$ mV in FIG. 13 described above, there is almost no dependence of delay time on the level of the compared signal, and jitter is small.

Furthermore, the delay is 1 ps or less, indicating that high-speed operation is performed which is almost identical to that of a circuit whose junctions are all $I_c \times R_n = 1.5$ mV.

From the above-described simulation results, it is understood that by applying Josephson junctions of different performances to each of different elemental circuits, the performance of the high-temperature superconducting device can be enhanced in its entirety.

Based on the above-described simulation results, a superconducting circuit device according to a third embodiment of the present invention is manufactured, which will be explained with reference of FIGS. 16A and 16B.

Figure 16A:
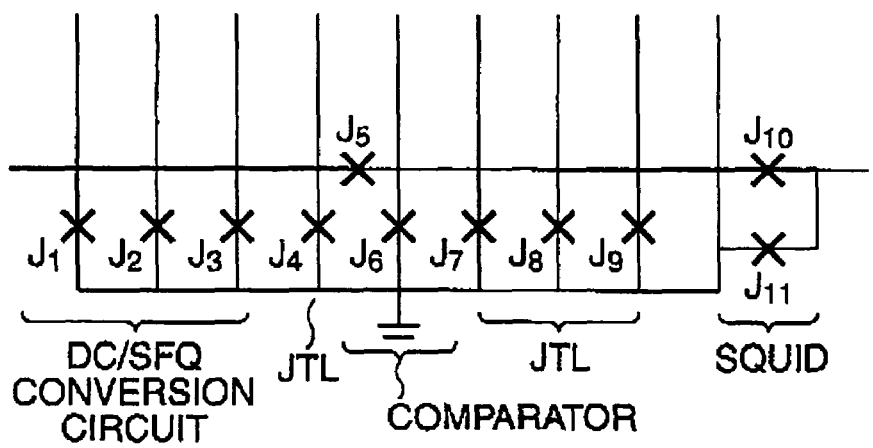
FIGS. 16A and 16B are explanatory views showing a superconducting circuit device according to a third embodiment of the present invention.

FIG. 16A shows an equivalent circuit diagram of a superconducting circuit device according to the third embodiment of the present invention. The circuit is similar to the circuit shown in FIG. 11, composed of a DC/SFQ converter containing Josephson junctions $J_1$, $J_2$, and $J_3$, a JTL containing Josephson junction $J_4$, a comparator containing Josephson junctions $J_5$ and $J_6$, a JTL containing Josephson junctions $J_7$, $J_8$, and $J_9$, and a read-out SQUID containing Josephson junctions $J_{10}$ and $J_{11}$.

Figure 16B:
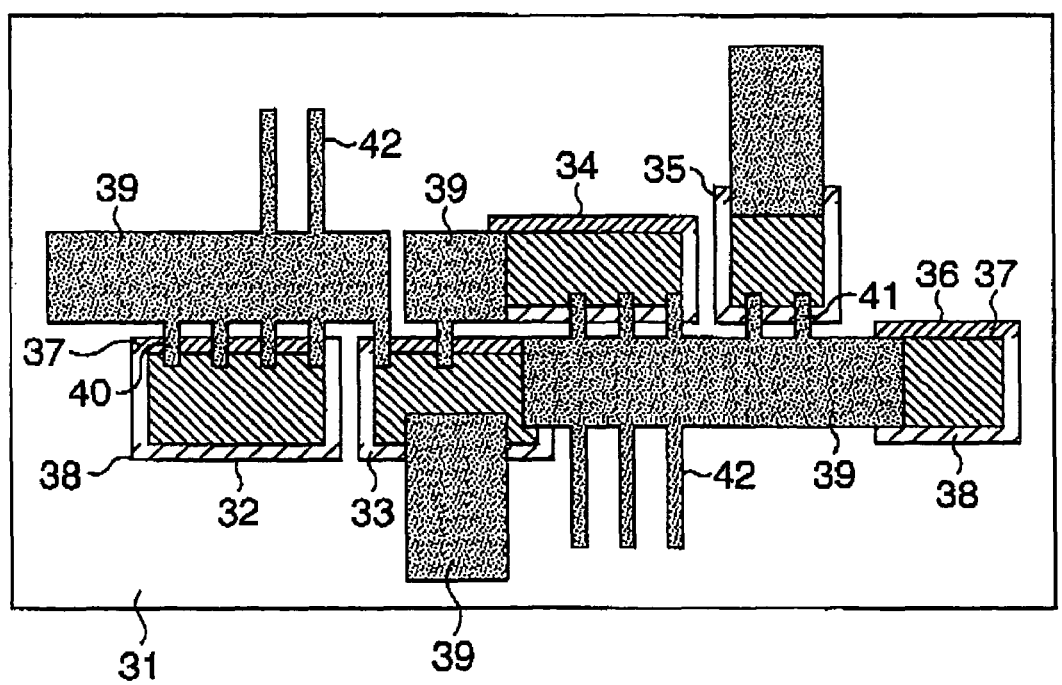

FIG. 16B is a layout to realize the superconducting circuit device shown in FIG. 16A. To several island regions 32 to 36 composed of a lower electrode layer and an insulating layer formed over a LSAT substrate 31, ion is irradiated from the specific direction shown in FIG. 3A so that different damage regions 37 and 38 are formed in each of the island regions 32 to 36.

Subsequently, a YBCO layer forming an upper electrode layer 39 is deposited, and thereafter patterning is performed so that bridges 40 and 41, and at the same time a lead-out wiring line 42 and so forth, are formed.

It is noted that the Josephson junction of the bridge 40 provided in the upper region in FIG. 16B has a high $J_c$, while the Josephson junction of the bridge 41 provided in the lower region has a low $J_c$.

Accordingly, the DC/SFQ converter and the JTL formed in the island region 32 are fabricated by the high-$J_c$ Josephson junction, and the comparator formed in the island region 33 is also fabricated by the high-$J_c$ Josephson junction.

On the other hand, the JTL formed in the island region 34, and a SQUID formed in the island region 35 are fabricated by the low-$J_c$ Josephson junction.

Specifically, the condition on the product of $L \times I_c$ of the SQUID is strict, so that a low-$J_c$ Josephson junction should be used therein, whereby the bridge width becomes wide and the inductance L becomes small.

As described above, by differentiating damages of the damage layer of the ramp slopes in an island region, Josephson junctions having different critical current densities can be formed in the one island region. Here, by separately using Josephson junctions with different performances depending on each element circuit, the performance of the entire high-temperature superconducting device can be enhanced without complicating the device configuration and with a simple configuration.

Figure 17:
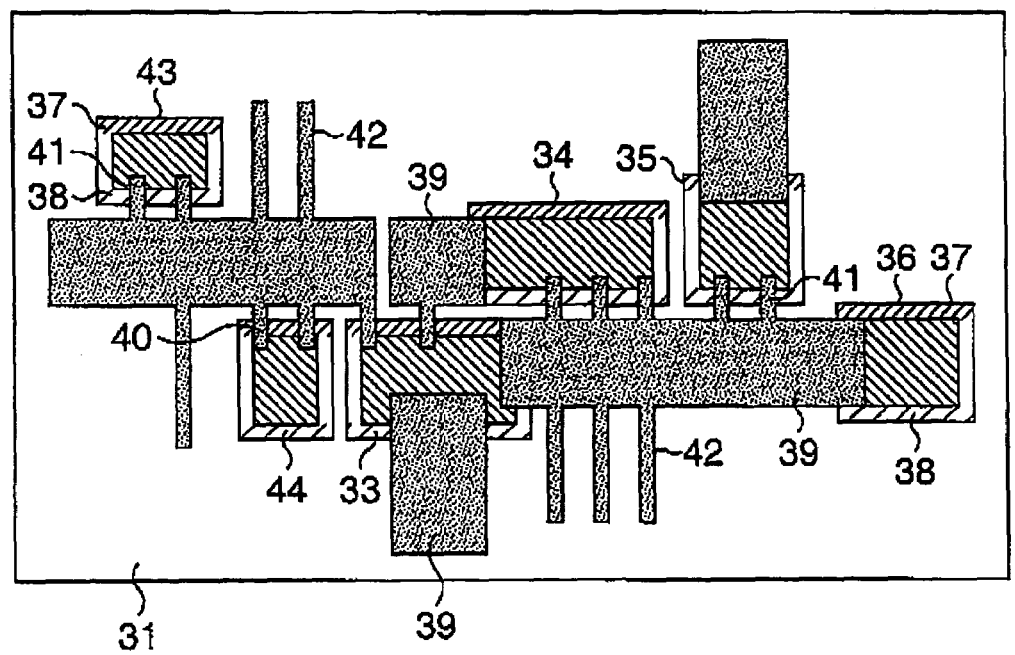
FIG. 17 is an explanatory view showing a modification example of the third embodiment of the present invention.
Figure 18:
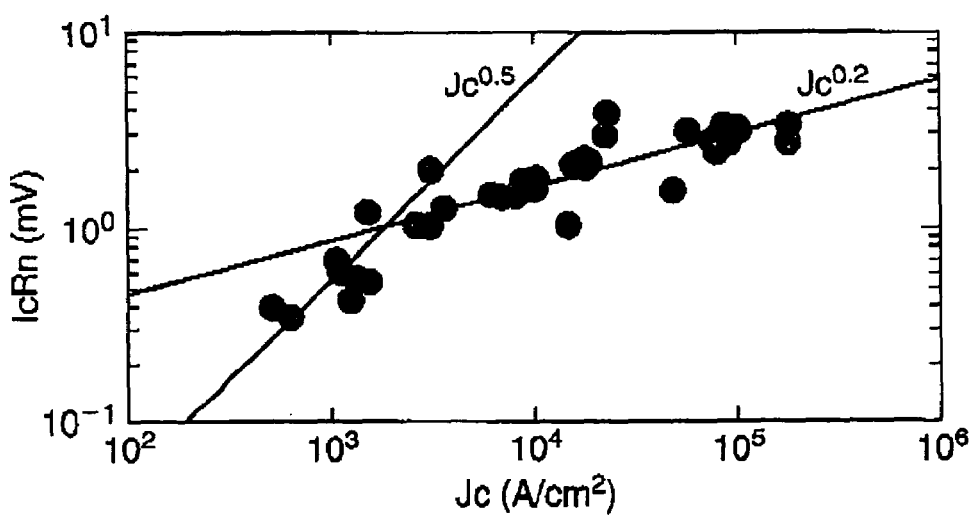
FIG. 18 is an explanatory graph showing dependence of the product of $I_c \times R_n$ on $J_c$.
Figure 19A:
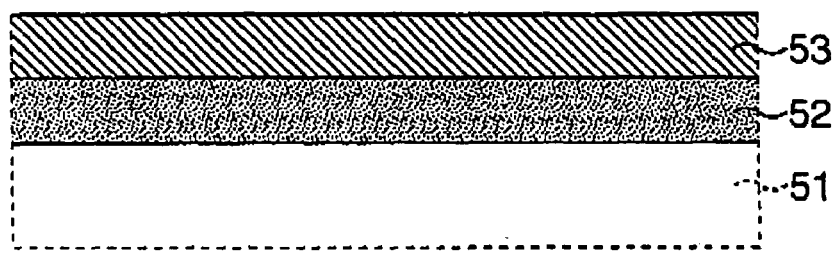
FIGS. 19A, 19B, and 19C are explanatory views respectively showing a halfway manufacturing process of a superconducting device having a conventional interface-engineered ramp-edge junction.
Figure 19B:
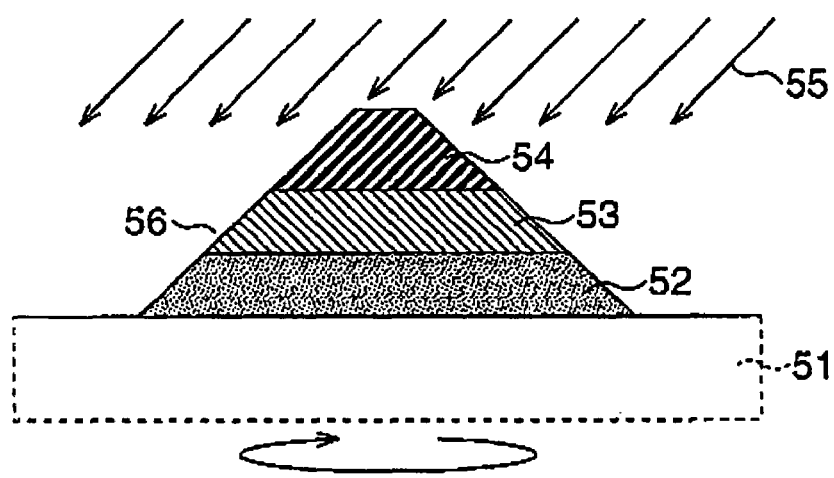
Figure 19C:
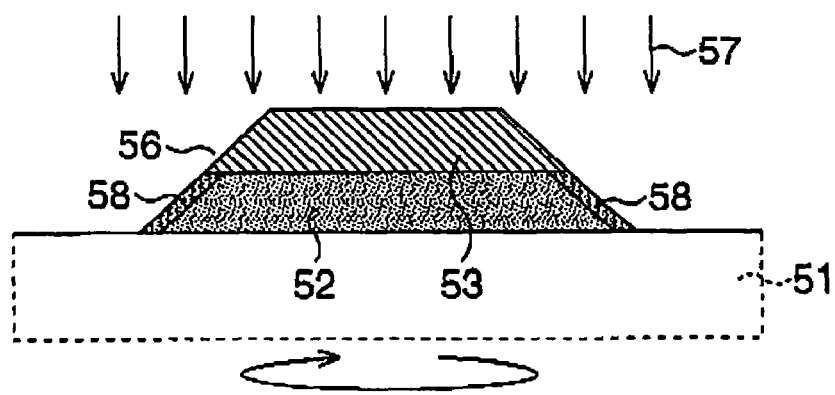
Figure 20A:
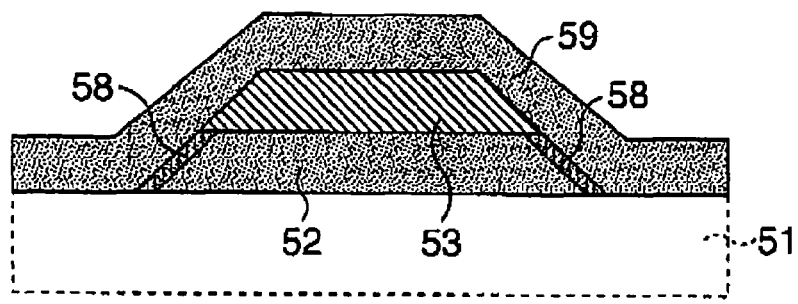
FIGS. 20A, 20B, 20C, and 20D are explanatory views showing the superconducting device manufacturing process of the conventional interface-engineered ramp-edge junction following the steps shown in FIGS. 19A to 19C.
Figure 20B:
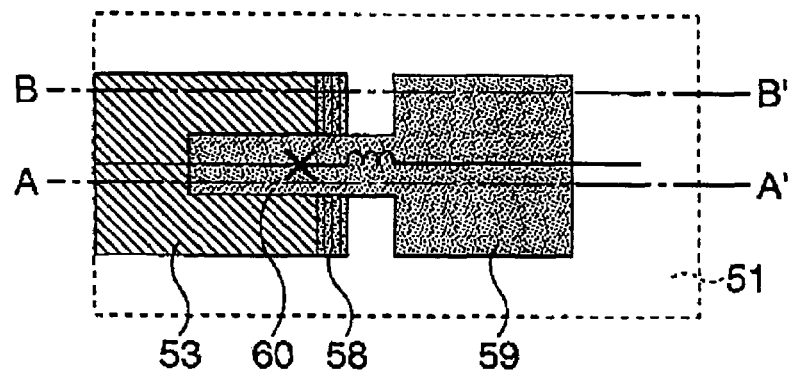
Figure 20C:
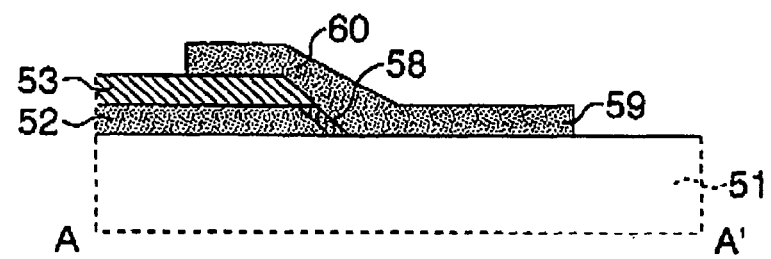
Figure 20D:
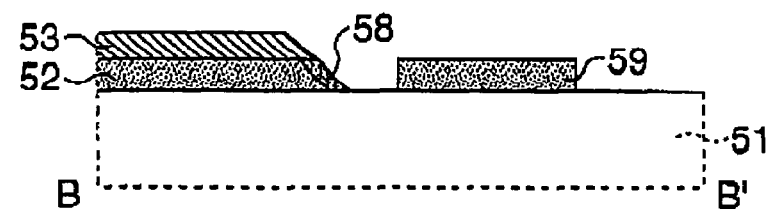

FIG. 17 shows another tangible configuration in order to realize the superconducting circuit device shown in FIG. 16A, in which the relationship with regard to the damage regions formed in each of the island regions 33 to 36, 43, and 44 is identical to that of FIG. 16B, while the locations of the bridges constituting the DC/SFQ converter are modified.

Specifically, two Josephson junctions $J_1$ and $J_2$ forming the DC/SFQ converter are low-$J_c$ Josephson junctions, while the rest of the Josephson junction $J_3$, as well as Josephson junction $J_4$ forming the JTL portion, is a high-$J_c$ Josephson junction.

Thus far each embodiment of the present invention has been described, but this invention is not limited to the configurations and conditions mentioned in the embodiments, and various modifications thereto are possible.

For example, in each of the above embodiments, LSAT, in other words, $[LaAlO_3]_{03}[Sr(Al,Ta)O_3]_{07}$, is used as a substrate, but it is also possible to use MgO, $SrTiO_3$, or the like.

Further, in each of the above-described embodiments, the lower electrode layer and upper electrode layer are formed of YBCO, which is $YBa_2Cu_3O_{7-x}$, but it is not a limitation, and $REBa_2Cu_3O_{7-x}$ can be also used.

It is noted that rhenium of $REBa_2Cu_3O_{7-x}$ is lanthanoid excluding praseodymium and cerium, and is blended singly or plurally to be included in a ratio of rhenium:barium:copper=1:2:3.

Furthermore, in each of the above-described embodiments, LSAT is used as the inter-layer insulating film, but the material is not limited to LSAT, but MgO, $CeO_2$, $SrTiO_3$, or the like can also be used.

Further, in the second embodiment described above, the barrier layer is formed of PBCO, which is $PrBa_2Cu_3O_{7-x}$, but it is not a restriction, and $CeBa_2Cu_3O_{7-x}$ or the like may also be used.

Also in each of the above embodiments, the laser deposition method is used for deposition of the YBCO film and the PBCO film, but it is not a limited method, and the sputtering method can also be used.

Furthermore, in the above first and third embodiments, argon ion is irradiated to form a damage layer, but it is not a limitation, and other rare gas ion such as neon, krypton, and xenon may be irradiated.

Further, in the above third embodiment and the modified example thereof, the ion milling method is used to form Josephson junctions having different $J_c$s, but similarly to the above second embodiment, the thickness of the deposited barrier layer may be differed to one another depending on each ramp slope, so as to form the Josephson junctions having different $J_c$s to one another.

Also in the above third embodiment and the modified example thereof, in an island region, the bridge is provided in the same ramp slope, so that Josephson junction having the same $J_c$s are formed. But it is possible to provide the bridge in a different ramp slope in an island region, so that Josephson junctions having different $J_c$s can be obtained.

Hence, ramp-edge-type junctions formed of an oxide superconductor and having a respective critical current density $J_c$, which is different to one another, can be separately used, so that particular element circuits within the superconducting circuit can be made high-speed or highly precise, allowing the performance of the entire high-temperature superconducting device to be enhanced. This should considerably contribute to practical application of various types of high-temperature sueprconducting device.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A high-temperature superconducting device comprising:
    a substrate, and
    a plurality of ramp-edge Josephson junctions having plural slopes in different directions formed on said substrate,
    wherein said plurality of ramp-edge Josephson junctions include at least two ramp-edge Josephson junctions having different critical current densities to one another, in accordance with the direction of said slopes.

2. The high-temperature superconducting device according to claim 1, wherein, among said Josephson junctions having different critical current densities, a Josephson junction having a relatively high critical current density forms a relatively high-speed operational circuit element, while a Josephson junction having a relatively low critical current density forms a relatively low-speed operational circuit element.

3. The high-temperature superconducting device according to claim 2, wherein said relatively high-speed operational circuit element which includes said Josephson junction having a relatively high critical current density is at least one of a pulse generator or a comparator.

4. The high-temperature superconducting device according to claim 3, wherein said Josephson junctions having different critical current densities to one another form an interface-engineered barrier layer having different damages, or a barrier layer formed of deposited films having different thickness to one another.

5. The high-temperature superconducting device according to claim 2, wherein said Josephson junctions having different critical current densities to one another form an interface-engineered barrier layer having different damages, or a barrier layer formed of deposited films having different thickness to one another.

6. The high-temperature superconducting device according to claim 1, wherein said Josephson junctions having different critical current densities to one another form an interface-engineered barrier layer having different damages, or a barrier layer formed of deposited films having different thickness to one another.

* * * * *